United States Patent [19]

Asanasavest

[11] Patent Number: 5,585,667

[45] Date of Patent: Dec. 17, 1996

[54] LEAD FRAME FOR HANDLING CROSSING BONDING WIRES

[75] Inventor: Chainarong Asanasavest, Santa Clara, Calif.

[73] Assignee: National Semiconductor Corporation, Santa Clara, Calif.

[21] Appl. No.: 363,399

[22] Filed: Dec. 23, 1994

[51] Int. Cl.$^6$ .......... H01L 23/495; H01L 23/48; H01L 23/52; H01L 29/40

[52] U.S. Cl. .......... 257/676; 257/666; 257/668; 257/692; 257/776

[58] Field of Search .......... 257/676, 666, 257/668, 692, 735, 700, 672, 776

[56] References Cited

U.S. PATENT DOCUMENTS

| | | | |
|---|---|---|---|
| 3,518,504 | 10/1967 | Dietcrich | 257/666 |
| 5,072,280 | 12/1991 | Matsukura | 257/666 |
| 5,086,018 | 2/1992 | Conru et al. | 437/207 |
| 5,229,329 | 7/1993 | Chai et al. | 437/218 |
| 5,455,452 | 10/1995 | Kiyono | 257/776 |

FOREIGN PATENT DOCUMENTS

| | | | |
|---|---|---|---|
| 0478240 | 2/1992 | European Pat. Off. | |
| 60-64442 | 4/1985 | Japan | 257/784 |
| 3-191547 | 8/1991 | Japan | 257/784 |
| 3-255655 | 11/1991 | Japan | 257/784 |
| 5-235245 | 9/1993 | Japan | 257/666 |
| 2263815 | 8/1993 | United Kingdom . | |

OTHER PUBLICATIONS

IBM Technical Disclosure Bulletin, vol. 34 No. 1, Jun. 1991 New York US, pp. 358–359. "Thin Small Outlene Packages".

Patent Abstracts Of Japan vol. No. 061 (E–1316), 5 Feb. 1993 & JP, A 04 267534 (NEC Kyushu Ltd) 24 Sep. 1992.

Patent Abstracts Of Japan vol. 016 No. 055 (E–1165), 12 Feb. 1992 & JP, A 03 255655 (NEC Corp) 14 Nov. 1991.

*Primary Examiner*—Mahshid Saadat
*Assistant Examiner*—Jhihan Clark
*Attorney, Agent, or Firm*—Hickman Beyer & Weaver

[57] ABSTRACT

A method is disclosed for packaging for an integrated circuit having lead frames with closely spaced leads that are configured in such a way that the bonding wires must cross over other leads prior to bonding to the appropriate lead. The method includes the formation of a modified lead frame such that the likelihood of electrical contact between the bonding wires and leads crossed over by bonding wires is reduced. In one embodiment, insulating film is placed on an adjacent lead, or additionally on a number of crossed over leads, directly under the path of the bonding wire such that the potential for electrical contact is reduced. In a second embodiment, a depression is formed on an adjacent lead, or additionally on a number of crossed over leads, causing additional clearance is created between the bonding wire and the lead such that the likelihood of contact is reduced. In a third embodiment, a stepped depression is formed on the bonded lead such that the depression facilitates the bonding of the wire at an increased incline resulting in additional space between bonding wire and the crossed leads thereby reducing the likelihood of contact.

13 Claims, 5 Drawing Sheets

LEAD FRAME FOR HANDLING CROSSING BONDING WIRES

BACKGROUND OF THE INVENTION

This invention relates generally to lead frames for use in integrated circuits packages. More particularly it relates to a modified lead frame for reducing the likelihood of electrical contact between the bonding wires and leads crossed over by the bonding wire.

As technology advances, the dimensions of integrated circuit packages continues to decrease therefore requiring corresponding decreases in integrated circuit dies. The decrease in the physical size of integrated circuit dies necessitates a similar reduction in the size of lead frames. This coincides with the leads of the lead frame approaching smaller and smaller dimensions (fine lead pitch) which increases the likelihood of electrical contact between bonding wires and other leads of the lead frame. This is especially a problem with lead frames having leads that are arranged in such a fashion that the path of the bonding wire, from the die to the appropriate lead to which it is bonded, crosses over other leads. In a conventional lead frame, as shown FIG. 1, the leads 4 form a radial pattern away from a die 6. The die 6 is wire bonded to leads 4 by bonding wires 8 such that they do not cross any other leads prior to bonding, therefore the aforementioned problem is not an issue. In lead frames where the leads are very small or are closely spaced, then there is an increased likelihood that the bonding wires may contact leads during the wire bonding process. A major factor influencing whether undesired contact will occur is the tolerance and precision of the wire bonding equipment during wire bonding.

There are also situations where undesired contact of bonding wires may result from random factors. By way of example, bonding wire sweep during the injection molding process causes the viscous encapsulating material to move the delicate bonding wires which may, in turn, cause contact with the leads. Them have been a number of methods employed to deal with bonding wire sweep. One successful technique is by using a glob-topping material to form a hardened barrier over the bonding wires prior to injection molding. Another has been to inject the material in such a way that the impact on the bonding wires is minimized, namely, injecting in direction as parallel to the bonding wires as possible. A disadvantage with glob-topping is that it adds additional steps and cost to the manufacturing process. Both methods are preventative type measures taken after a successful bonding process and neither will prevent contact caused by the wire bonding process itself. It is therefore an objective of the present invention to provide a method and apparatus that reduces the likelihood of bonding wire contact with crossed leads that is both simple and cost effective.

SUMMARY OF THE INVENTION

To achieve the foregoing and other objects and in accordance with the purpose of the present invention, a method is disclosed for packaging an integrated circuit using a lead frame having closely spaced leads that are patterned in such a way that one or more bonding wires must cross over another lead in order to be bonded to its associated lead. The method includes the formation of a modified lead frame such that the likelihood of electrical contact between the bonding wires and leads crossed over by bonding wires is reduced.

In a first embodiment of the invention, an insulating film is formed on an adjacent lead such that it is directly under the path where the bonding wire crosses the adjacent lead so that even if the bonding wire inadvertently contacts the crossed lead, an electrical connection will not be made between the crossed lead and the bonding wire. In one preferred embodiment in which the lead frame is formed by etching using a mask, the insulating film may take the form of a portion of the mask left in place for etching the lead frame. The insulating film may also be positioned on additional crossed leads for an added margin of safety.

In a second embodiment of the present invention, the insulating film is replaced by a depression formed on the adjacent lead such that additional clearance is created between the bonding wire and the adjacent lead thus reducing the likelihood of electrical contact. The depression can be formed by either coining (stamping) or by etching. To increase the margin of safety, additional depressions may further be formed into other crossed leads as well.

In a third embodiment, the method a stepped depression is formed on a lead at the point where the bonding wire bonds to the lead. The walls of the depression cause the inclination of the bonding wire to be at an increased incline such that additional clearance is created between the bonding wire and the adjacent leads to reduce the likelihood of electrical contact. Again, the depression on the bonded lead may be formed by coining (stamping) or etching. Further, depressions on the adjacent and crossed leads may be formed, either by coining or etching, to further increase the margin of safety from contact.

BRIEF DESCRIPTION OF THE DRAWINGS

The invention, together with further objects and advantages thereof, may best be understood by reference to the following description taken in conjunction with the accompanying drawings in which:

FIG. 2b is a diagrammatic top view of die wire bonded on both sides of the lead frame in FIG. 2a.

DETAILED DESCRIPTION OF THE PREFERRED EMBODIMENTS

One lead frame configuration that-may encounter the types of problems described in the background section of this application is illustrated in FIG. 2. Such a lead frame is disclosed in Matthew et al. co-pending application Ser. No. 08/329992 entitled "A Leadframe for an Integrated Circuit Package which Electrically Interconnects Multiple Integrated Circuit Die" and filed Oct. 27, 1994. The referenced application is incorporated by reference herein in its entirety. As will be apparent to those skilled in the art after reading the present application, the invention is applicable to a wide variety of other lead frame designs as well.

Figure 1:
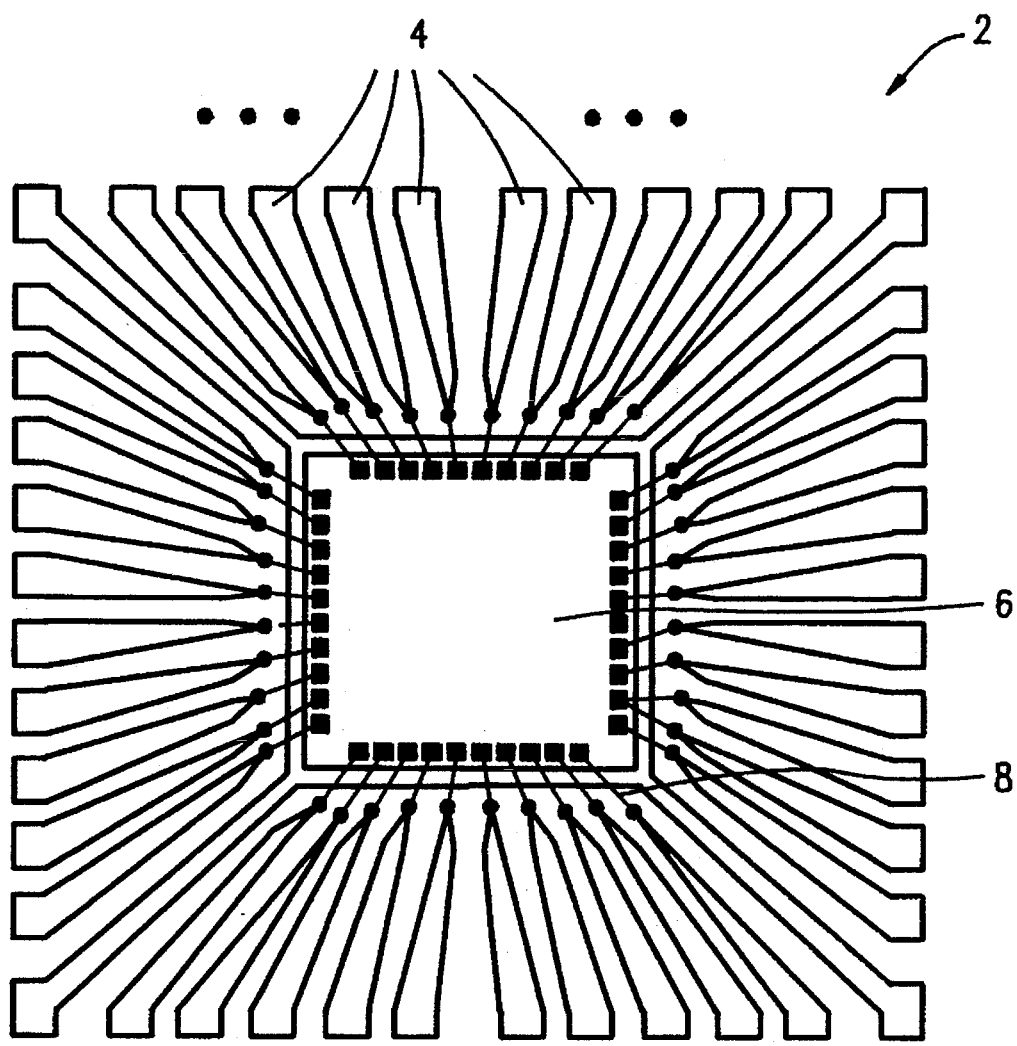
FIG. 1 is a diagrammatic top view of a conventional lead frame wire bonded to a die.
Figure 2A:
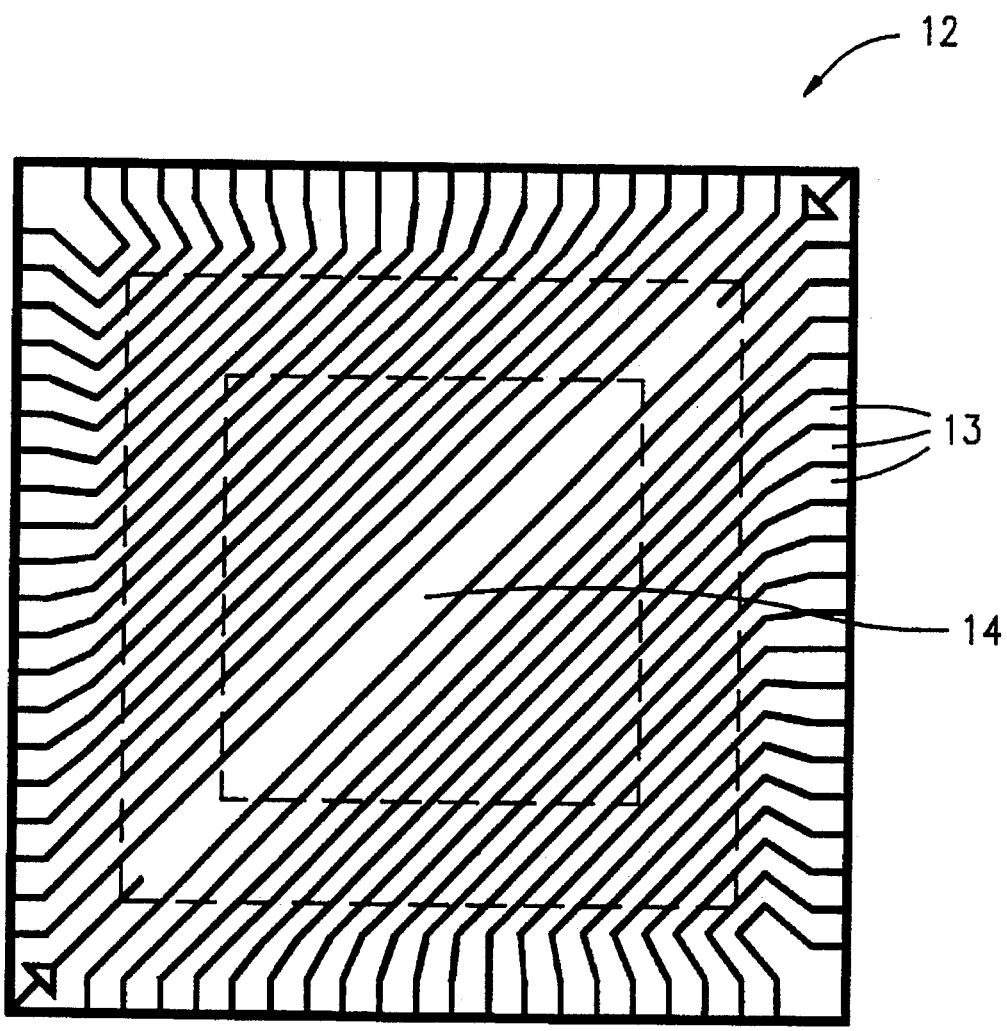
FIG. 2a is a diagrammatic top view of a lead frame with diagonal leads.
Figure 2B:
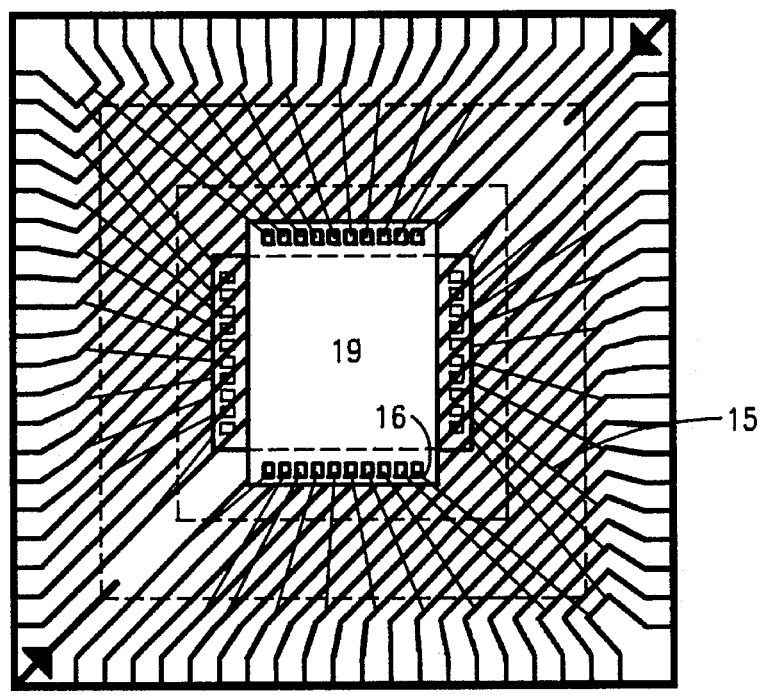

In the embodiment illustrated in FIG. 2a, leads 13 of lead frame 12 are configured in a diagonal and substantially parallel pattern. The leads are closely spaced (fine pitch) and run through the die attach area 14. The die attach area, used in this context, refers to a support area on a lead frame. In other embodiments, it may refer to a conventional die attach pad, a cleared or void area on a substrate, or as in this case, a support area on a lead frame. The lead frame illustrated in FIG. 2 may allow for two sided bonding and is particularly useful in instances where common leads may be bonded to multiple integrated circuits (IC) dies. By way of example, IC dies for memory circuits may be connected to common leads used for address lines. EPROMs, DRAMs and SRAMs are some examples of memory circuits which are ideal applications for such lead frames. Also, any application where multiple dies may use common leads are good candidates for these types of lead frames. FIG. 2b shows an example of a pair of die 19 bonded on opposite sides of lead frame 12 of FIG. 2a. Each die 19 has a plurality of bond pads 16 to which the bonding wires 15 are bonded to electrically couple the die to common leads of the lead frame 12.

Figure 2C:
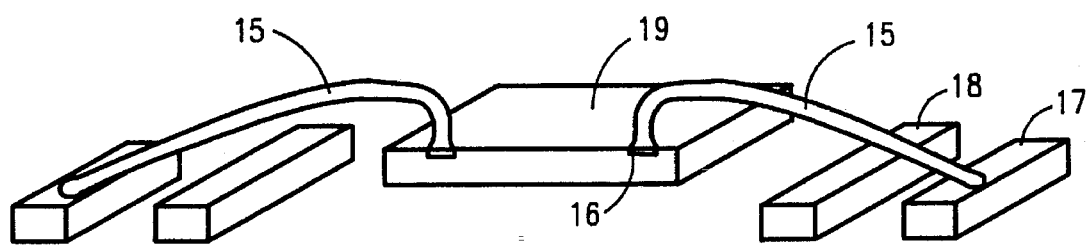
FIG. 2c is a partial perspective view of bonding wires ball bonded to a die and stitch bonded to leads where the bonding wire crosses over an adjacent leads.

FIG. 2c illustrates a common bonding technique that may be used in conjunction with the present invention. A first end of bonding wire 15 is bonded to an associated die bond pad 16, with a ball bond where the wire bonding is typically performed by a wire bonder. The second end of bonding wire 15 is bonded to an associated lead, as for example, using a stitch bond.

A typical wire bonder bonds bonding wires by ultrasonic welding using a transducer and capillary arrangement (not shown). The ball bond bonded to the die bond pad 16 is initially performed by placing the transducer arrangement over a die bond pad 16 where bonding wire 15 is ultrasonically attached in a substantially vertical manner. The bonding wire 15 is then continuously fed through the capillary until the arrangement is positioned over an appropriate lead. The bonding wire 15 is then cut off and laid down on lead 17 in a substantially horizontal position, relative to the leads, and ultrasonically bonded by transducer. This type of substantially horizontal bond is referred to as a stitch bond. Since the stitch bond attaches substantially horizontally to lead 17, the bonding wire 15, in its approach to lead 17, crosses very closely over an adjacent lead 18 and stands a good chance of contact if the bonding wire 15 moves slightly such during injection molding. Hence, the following discussion is directed toward several effective techniques for reducing the likelihood of such contact.

Figure 3:
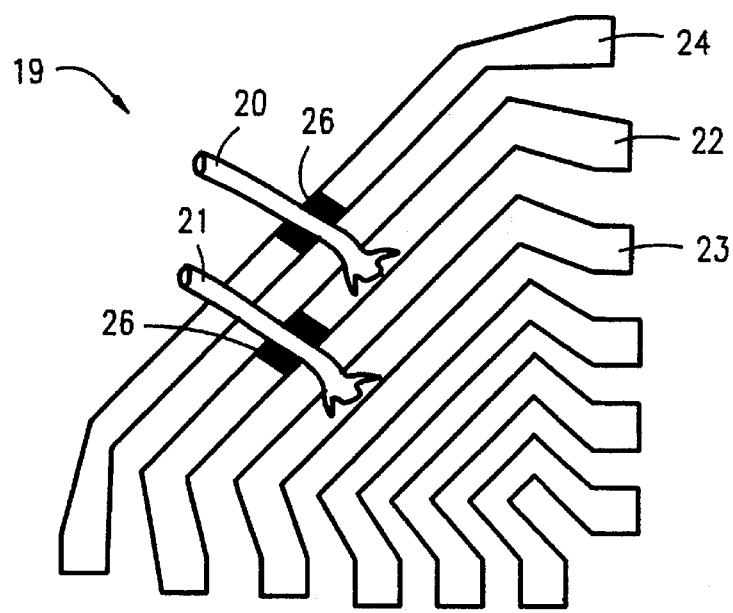
FIG. 3 is a diagrammatic top sectional view of a first embodiment of the present invention having an insulating film positioned on a crossed lead below the region that a bonding wire crosses the crossed lead.

Referring next to FIG. 3 a first embodiment of a lead frame in accordance with the present invention will be described. FIG. 3 illustrates a corner portion of a lead frame 12 of the general type shown in FIGS. 2a and 2b. A first bonding wire 20 is bonded at one end to an associated bonding pad 16 on a die 19 located in the die attach area 14 (of FIG. 2a) near the center of the lead frame as seen in FIG. 2b. The other end of bonding wire 20 is bonded to lead 22. As seen best in FIG. 3, the bonding wires must cross over an adjacent lead 24. An electrically insulating film 26 is positioned on leads 22 and 24 so that it lies directly under the path of bonding wires 20 and 21 to prevent electrical shorting if the bonding wires should come into contact with the insulating film 26. To prevent electrical contact, the length of the insulating film should be at least the diameter of the bonding wire, but more preferably, it should be several times longer than the bonding wire diameter (typically around 1.3 mils) in order to protect an adequate size area. A length of about six times the diameter of the bonding wire (about 8 mils) has been found to provide sufficient protection.

The method used to manufacture the lead frames may be exploited to lay down the insulating film during the lead frame manufacturing process. Lead frames are typically formed either by stamping or etching a sheet of electrically conductive material such as copper or a copper alloy, both techniques are well known to those skilled in the art. When etching is used, an etching mask is typically laid down on the copper sheet with the desired lead pattern. Rather than removing the entire mask, portions of the mask may be left on leads for use as insulating film. As those skilled in the art can appreciate, when the lead frame is etched, using portions of the mask as the insulating film is both economical and efficient. In the case where the lead frame is formed by stamping, a subsequent step of laying down the insulating film must be performed prior to wire bonding.

Figure 4:
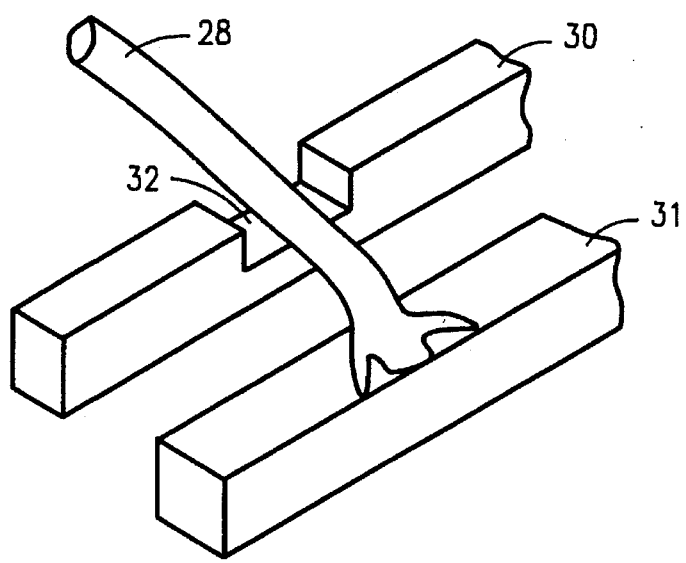
FIG. 4 is a partial perspective view of a second embodiment of the present invention illustrating a depression formed on an adjacent crossed lead.

A second embodiment in accordance with the present invention is illustrated in FIG. 4. This technique involves "coining" the crossed lead in the region where a bonding wire crosses the lead to create a depression that provides additional space between the bonding wire and the crossed lead(s) thereby reducing the likelihood of contact. As illustrated in FIG. 4, a first end of a bonding wire 28 is connected to a die (not shown). The second end of the bonding wire is bonded to a lead 31 and is positioned such that it crosses over an adjacent lead 30 before being bonded to the lead 31. Since the adjacent lead 30 is the most likely lead to come into contact with bonding wire 28, a depression 32 is "coined" into lead 30 directly beneath the path of bonding wire 28 where contact is most likely. This increases the space between bonding wire 28 and lead 30 therefore reducing the likelihood of contact. As used herein, the term "coined" and "coining" are intended to refer to the creation of depressions in a lead, regardless of whether the depression is formed by stamping, etching, molding or other suitable techniques.

The depression 32 is preferably made during formation of the lead frame and therefore takes place prior to wire bonding. When the lead frame is formed by etching, then etching the depression during the lead frame's formation is most efficient so that the depression may be formed together with the lead frame. When the lead frame is stamped, the depressions may be formed by coining at the same time the lead frame is stamped. The length of the depression must be sufficiently long for the bonding wire to fit in between the depression without contacting the sidewalls, i.e., the depression must be somewhat longer than the diameter of the bonding wire. The depth of the depression may be anywhere in the range of about one half to three forths of the lead's thickness since further increases in depth may affect the structural integrity of the lead. In accordance with the preferred embodiment, a depression length of at least five times the diameter of the bonding wire of 1.3 mils and a depth of about half the depth of the lead has been found to work well. A higher margin of safety may be achieved by forming depressions on additional crossed leads in the bonding wire path as well.

Figure 5:
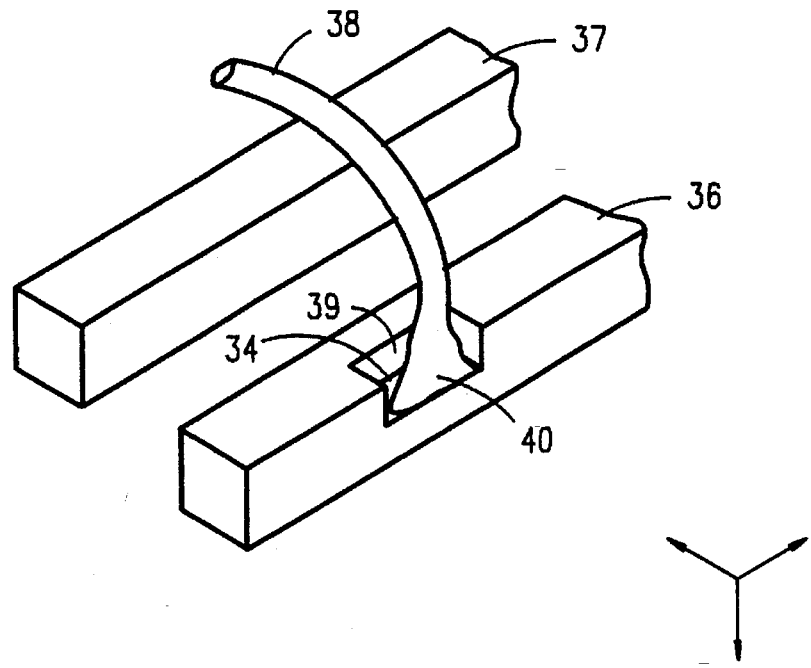
FIG. 5 is a partial perspective view of a third embodiment illustrating a stepped depression formed at the point of bonding.

Referring next to FIG. 5, a third embodiment in accordance with the present invention will be described. In this embodiment, a stepped depression is formed at the point at which bonding to the lead occurs. The depression is positioned such that the bonding wire will be forced to pass over an unstepped portion of the lead, which serves to force the bonding wire to be "lifted" away from the lead frame surface. This serves to reduce the likelihood of contact between the bonding wire and an adjacent lead. As seen in FIG. 5, a stepped depression 34 is formed on lead 36 such that when the bonding wire 38 is bonded to depression 34, the back wall 39 of the depression 34 supports the bonding wire 38 at an increased incline thereby creating additional space between bonding wire 38 and adjacent lead 37. The length of depression 34 must be sufficiently long to allow for bonding. Since the end of the bonding wire tends to spread out when pounded during ultrasonic bonding, shown as a flattened end 40, the length must be long enough to accommodate. The depth of the depression may vary a great deal in accordance with the needs of a particular system. By way of example, depths in the range of about 2 to 3 mils, have been found to work well for 6 mil lead frames. In one embodiment, a 3 mil depression (i.e. about a half the lead frame thickness) works well. It should be appreciated that the width of the depression must allow for a sufficiently sturdy back wall to support the bonding wire in its inclined position. In one preferred embodiment, a length of about five times the diameter of the bonding wire, a depth of about half of the depth of the lead, and a width of about half of the width of the lead has been found to work well.

Formation of the depression may be accomplished using any suitable method, including, stamping, etching or molding. Again, it is generally preferred that the method used to form the depression is the same as the method used in forming the lead frame so that they may both be formed during the same step, although this is not a requirement.

Figure 6:
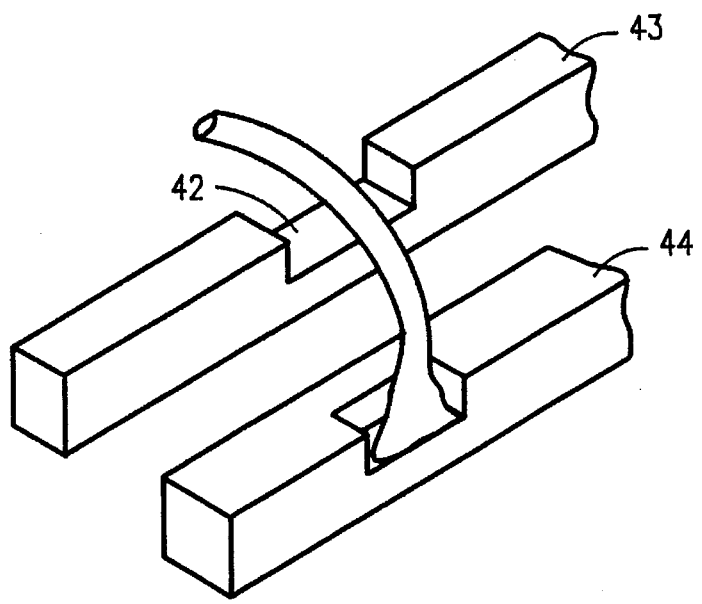
FIG. 6 is a partial perspective view of a modification of the embodiment of FIG. 5 which further includes a depression on an adjacent crossed lead.

Although three embodiments of the present invention have been described in detail, it should be understood that the present invention may be embodied in other specific forms without departing from the spirit or scope of the invention. For example, the various described embodiments may be used together in any combination to further reduce the likelihood of electrical contact between the bonding wire(s) and the crossed lead(s). For example, as illustrated in FIG. 6, a depression 42 in accordance with the second described embodiment may be formed an adjacent crossed lead 43, while a stepped depression 34 is formed in the bonded lead 44 in accordance with the third described embodiment. Additional depressions may also be formed on other crossed leads if so desired and/or insulating surfaces may be provided.

While this invention has been described primarily in terms of a lead frame having diagonally patterned leads, it should be understood that the diagonally pattered leads are for illustrative purposes only and that the invention may be applied to any type of lead frames where leads are crossed by bonding wires such as in lead frames for multi-chip applications, for example. Therefore the present examples are to be considered as illustrative and not restrictive, and the invention is not to be limited to the details given herein, but may be modified within the scope of the appended claims.

What is claimed is:

1. An integrated circuit package, comprising:

an etched lead frame having a plurality of leads, said lead frame defining a die attach area, wherein the plurality of leads are arranged to form diagonal conductive strips through the die attach area.

a die affixed in the die attach area, the die having a plurality of bond pads;

a plurality of bonding wires for electrically coupling the die to the leads, a selected one of the bonding wire having a first end and a second end, the first end being bonded to an associated one of the bond pads on the die and the second end being bonded to an associated first lead on the lead frame, the selected bonding wire being arranged such that the selected bonding wire passes over a second lead of the lead frame that is positioned adjacent to the first lead;

an insulating film applied to the second lead at a position directly fly under the path of the selected bonding wire such that the likelihood of electrical contact between the selected bonding wire and the second lead is reduced, wherein the insulating film is an etching mask applied prior to an etching of the lead frame; and an encapsulating material formed around the die, bonding wires, and an inner portion of the lead frame to provide a protective package.

2. An integrated circuit package as recited in claim 1 wherein the die attach area is selected from a group consisting of: a die attach pad, a void area on a substrate, and a support area on a lead frame.

3. An integrated circuit package as recited in claim 1 wherein the insulating film is further applied to a plurality of crossed leads.

4. An integrated circuit package as recited in claim 1 wherein the encapsulating material is an injection molded plastic.

5. An integrated circuit package, comprising:

a lead frame having a plurality of leads, said lead frame defining a die attach area, wherein the plurality of leads form diagonal conductive strips through the die attach area;

a die affixed in the die attach area, the die having a plurality of bond pads;

a plurality of bonding wires for electrically coupling the die to the leads, a selected one of the bonding wires having a first end and a second end, the first end being bonded to an association one of the bond pads on the die and the second end being bonded to an associated first lead on the lead frame, the selected bonding wire being arranged such that the selected bonding wire passes over a second lead of the lead frame that is positioned adjacent to the first lead;

an insulating film applied to the second lead at a position directly under the path of the selected bonding wire such that the likelihood of electrical contact between the selected bonding wire and the second lead is reduced; and an encapsulating material formed around the die, bonding wires, and an inner portion of the lead frame to provide a protective package.

6. An integrated circuit package as recited in claim 5 wherein the insulating film is a photoresist defined by an etching mask applied prior to an etching of the lead frame.

7. An integrated circuit package, comprising:

a lead frame having a plurality of leads, said lead frame defining a die attach area, wherein the plurality of leads form a diagonal conductive strips through the die attach area;

a die affixed in the die attach area, the die having a plurality of bond pads;

a plurality of bonding wires for electrically coupling the die to the leads, a selected one of the bonding wires having a first end and a second end, the first end being bonded to an associated one of the bond pads on the die and the second end being bonded to an associated first lead on the lead frame, the selected bonding wire being arranged such that the selected bonding wire passes over a second lead of the lead frame that is positioned adjacent to the first lead;

a depression formed on the second lead directly under the path of the selected bonding wire such that additional clearance is created between the selected bonding wire and the second lead thereby reducing the likelihood of electrical contact; and an encapsulating material molded around the die, bonding wires, and inner portion of the lead frame to provide a protective package, wherein the encapsulation material is molded directly over the depression such that the encapsulation material directly contacts the depression.

8. An integrated circuit package as recited in claim 7 wherein the encapsulating material is an injection molded plastic.

9. An integrated circuit package as recited in claim 7 wherein further depressions are formed on a plurality of crossed leads.

10. An integrated circuit package, comprising:

a lead frame having a plurality of leads, said lead frame defining a die attach area;

a die affixed in the die attach area, the die having a plurality of bond pads;

a plurality of bonding wires for electrically coupling the die to the leads, a selected one of the bonding wires having a first end and a second end, the first end being bonded to one of the bond pads on the die and the second end being bonded to an associated first lead on the lead frame, the selected bonding wire being arranged such that the selected bonding wire passes over a second lead of the lead frame that is positioned adjacent to the first lead, the bond between the second end of the selected bonding wire and the associated lead on the lead frame defining a lead bonding area;

a depression formed on the lead bonding area thereby causing the selected bonding wire to be attached to the lead at an increased incline such that additional clearance is created between the selected bonding wire and the second lead thereby reducing the likelihood of electrical contact; and an encapsulating material formed around the die, bonding wires, and inner portion of the lead frame to provide a protective package.

11. An integrated circuit package as recited in claim 10 wherein a depression is formed on the second lead.

12. An integrated circuit package as recited in claim 10 wherein the encapsulating material is an injection molded plastic.

13. An integrated circuit package as recited in claim 11 wherein further depressions are formed on a plurality of crossed leads.

* * * * *

UNITED STATES PATENT AND TRADEMARK OFFICE
CERTIFICATE OF CORRECTION

PATENT NO. : 5,585,667
DATED : December 17, 1996
INVENTOR(S) : Chainarong Asanasavest It is certified that error appears in the above-indentified patent and that said Letters Patent is hereby corrected as shown below:

Column 1, line 40, change "Them" to --There--.
Column 2, line 65, change "that-may" to --that may--.
Column 6, line 11, after "directly" delete --fly--.

Signed and Sealed this

Eighth Day of July, 1997

*Attest:*

BRUCE LEHMAN

*Attesting Officer*  Commissioner of Patents and Trademarks